United States Patent [19]

Takemae

[11] 4,409,672

[45] Oct. 11, 1983

[54] DYNAMIC SEMICONDUCTOR MEMORY DEVICE

[75] Inventor: Yoshihiro Takemae, Yokohama, Japan

[73] Assignee: Fujitsu Limited, Kawasaki, Japan

[21] Appl. No.: 249,702

[22] Filed: Mar. 31, 1981

[30] Foreign Application Priority Data

Mar. 31, 1980 [JP] Japan .................................. 55-41810

[51] Int. Cl.³ ...................... G11C 11/40; G11C 11/24
[52] U.S. Cl. ................................................. 365/149
[58] Field of Search ........................ 365/149, 189, 203

[56] References Cited

U.S. PATENT DOCUMENTS 3,986,180  10/1976  Cade ..................................... 365/149
4,168,536  9/1979   Joshi et al. ........................... 365/149
4,240,092  12/1980  Kuo ..................................... 365/149
4,259,729  3/1981   Tokushige ........................... 365/149

OTHER PUBLICATIONS

Arzubi, "Sense Amplifier for Capacitive Storage", IBM Tech. Disc. Bul., vol. 19, No. 2, 7/76, pp. 407–408.

Primary Examiner—Stuart N. Hecker
Attorney, Agent, or Firm—Staas & Halsey

[57] ABSTRACT

A dynamic semiconductor memory device incorporating memory cells of a one-transistor and one-capacitor type is provided with increased charge storage and thus improved read operation. In this device, each of the memory cells is connected to one word line, to one bit line and to one power supply line. The potential of the power supply line is toggled low then high so as to store more charges in the capacitor of a memory cell.

8 Claims, 23 Drawing Figures

| Fig. 5A |
|---|
| Fig. 5B |

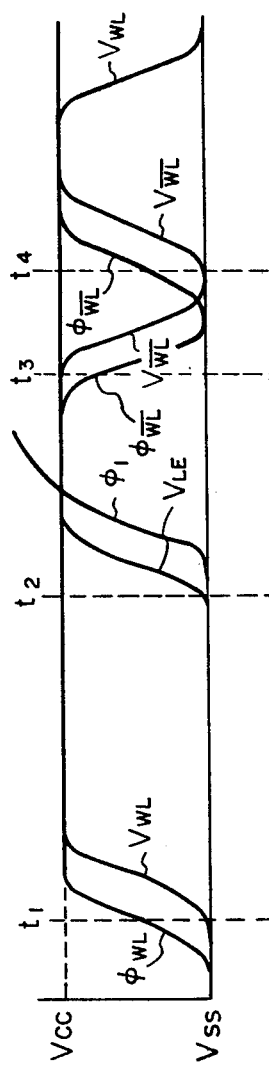
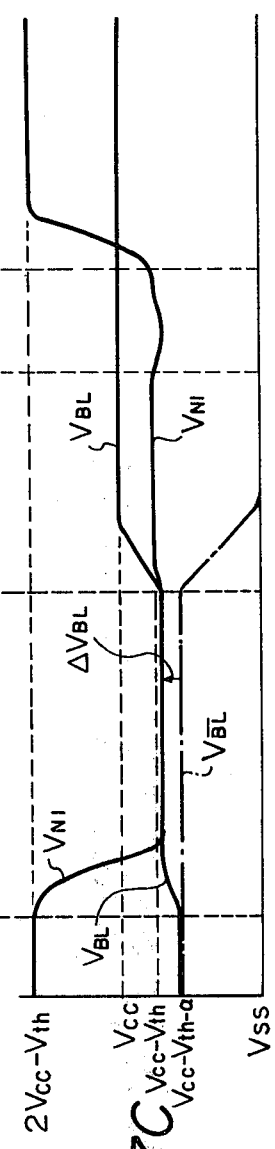
Fig. 7A  Fig. 7B  Fig. 7C

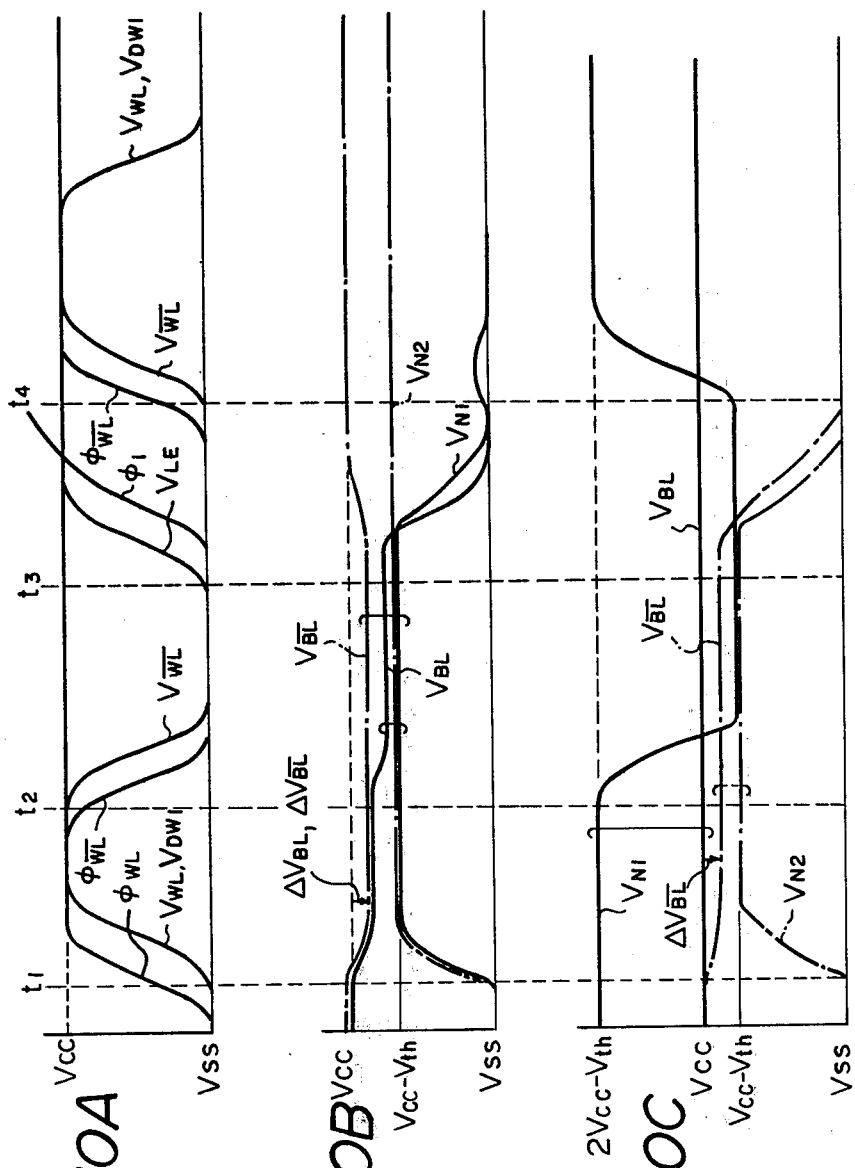

DYNAMIC SEMICONDUCTOR MEMORY DEVICE

BACKGROUND OF THE INVENTION

The present invention relates to a semiconductor memory device and, more particularly, to an MIS (Metal-Insulator-Semiconductor) dynamic memory device of a one-transistor and one-capacitor type.

In general, an MOS (broadly, MIS) dynamic memory device of a one-transistor and one-capacitor type incorporates memory cells, each comprising a transistor and a capacitor. In this case, the transistor serves as a switching gate for charging or discharging the capacitor. In addition, the presence of charges in the capacitor corresponds to the data "0" or "1". For example, the state in which the capacitor is discharged corresponds to the data "0", while the state in which the capacitor is charged corresponds to the data "1".

The above-mentioned transistor has a gate connected to a word line, a drain connected to a bit line and a source. The source is connected to one electrode of a capacitor. This capacitor has another electrode connected to a power supply, which is usually the ground or another power supply $V_{cc}$. In the stand-by state, the bit line is precharged by the power supply $V_{cc}$.

Therefore, if the data "0" is stored in the memory cell, a charge $Q_1$ stored in the capacitor thereof is $$Q_1 = 0.$$

Contrary to the above, if the data "1" is stored in the memory cell, a charge $Q_2$ stored in the capacitor thereof is $$Q_2 = C(V_{cc} - V_{th})$$

where C is the capacitance of the capacitor;
$V_{cc}$ is also a voltage of the power supply $V_{cc}$; and
$V_{th}$ is a threshold voltage of the transistor. Therefore, the difference $\Delta Q$ between the charges $Q_1$ and $Q_2$ is $$\Delta Q = C(V_{cc} - V_{th})$$

However, in the above-mentioned memory cell in which the other electrode of the capacitor is connected to the power supply $V_{cc}$ or the ground, in other words, the potential of the other electrode is definite, the difference $\Delta Q$ is relatively small. This leads to an unstable read operation, since the operation of a sense amplifier for amplifying the difference in potential between the bit lines is dependent upon the difference $\Delta Q$.

SUMMARY OF THE INVENTION

It is a principal object of the present invention to provide a semiconductor memory device with a stable read operation.

According to the present invention, there is provided a semiconductor memory device comprising: first and second power supplies, the potential of the second power supply being lower than that of the first power supply; a plurality of word lines; a plurality of power supply lines; a plurality of pairs of bit lines; a plurality of sense amplifiers, arranged between a respective pair of the pairs of bit lines; and a plurality of memory cells, each comprising a transistor and a capacitor. The transistor has a gate connected to one of the word lines and a drain connected to one of the bit lines; the capacitor has an electrode connected to a source of the transistor and another electrode connected to one of the power supply lines. The semiconductor memory device further comprises a plurality of means, connected to one of the power supply lines, for supplying a clock signal thereto after the rising of the potential of one of the word lines, wherein the potential of the clock signal falls and after that, rises. In the present invention, the difference between the charges $Q_1$ and $Q_2$ corresponding to the data "0" and "1" is increased due to the bootstrap effect, without changing the structure of the memory cells.

BRIEF DESCRIPTION OF THE DRAWINGS

The present invention will be more clearly understood from the following description contrasting the present invention with the conventional device and with reference to the accompanying drawings, wherein:

FIGS. 7A, 7B and 7C are timing diagrams of the signals appearing in the circuit of FIG. 6;

FIGS. 8, 8A and 8B are a block diagram illustrating another embodiment of the semiconductor memory device according to the present invention;

FIGS. 10A, 10B and 10C are timing diagrams of the signals appearing in the circuit of FIG. 9.

DESCRIPTION OF THE PREFERRED EMBODIMENTS

Figure 1A:
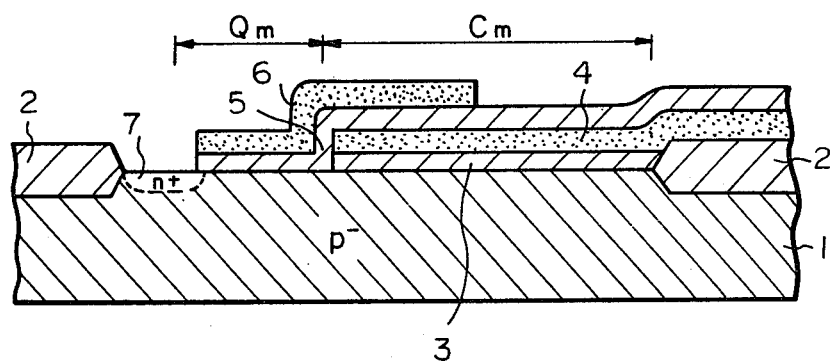
FIG. 1A is a cross-sectional view illustrating a memory cell of a one-transistor and one-capacitor type.

Referring to FIG. 1A, which illustrates a one-transistor and one-capacitor type memory cell, the memory cell is manufactured by using a so-called double-layer polycrystalline silicon technology. In FIG. 1A, 1 is a semiconductor substrate which is, for example, $p^-$-type monocrystalline silicon; 2 is a field layer which is relatively thick and made of, for example, silicon dioxide; 3 and 5 are insulating layers which are relatively thin and made of, for example, silicon dioxide; 4 and 6 first and second conductive layers, respectively, and made of, for example, polycrystalline silicon; and 7 is an $n^+$-type impurity doped region. In this case, an MOS transistor $Q_m$ comprises a source formed by an inversion layer within the substrate 1 under the insulating layer 3, a drain formed by the impurity doped region 7 and a gate formed by the second conductive layer 6, while a capacitor $C_m$ comprises one electrode formed by the substrate and the other electrode formed by the first conductive layer 4 with the insulating layer 3 therebetween. Of course, various kinds of memory cells of a one-transistor and one-capacitor type have been developed; however, the memory cell as illustrated in FIG. 1A is a representative one which has an advantage in that the integrated density thereof is high.

Figure 1B:
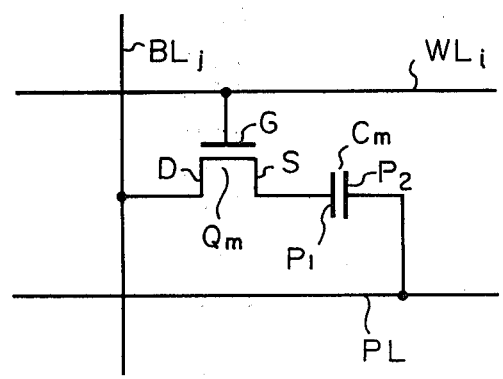
FIG. 1B is an equivalent circuit diagram of the memory cell of FIG. 1A.

FIG. 1B is an equivalent circuit diagram of the memory cell of FIG. 1A. In FIG. 1B, in the transistor $Q_m$, a drain D and a gate G are connected to a bit line $BL_j$ and a word line $WL_i$, respectively, and in addition, a source S is connected to an electrode $P_1$ of the capacitor $C_m$ which, in turn, has a electrode $P_2$ connected to a power supply line PL. In general, the power supply line PL is grounded.

The transistor $Q_m$ is used for charging or discharging the capacitor $C_m$. For example, when the potential of the word line $WL_i$ is high (in this case, the transistor $Q_m$ is of an n-channel type), the bit line $BL_j$ is electrically connected to the electrode $P_1$ of the capacitor $C_m$ so that a charge is transferred from the bit line $BL_j$ to the electrode $P_1$ or vice versa in response to the potential of the bit line $BL_j$. In this case, the absence or presence of a charge in the electrode $P_1$ of the capacitor $C_m$ corresponds to the data "0" or "1" respectively.

Figure 2A:
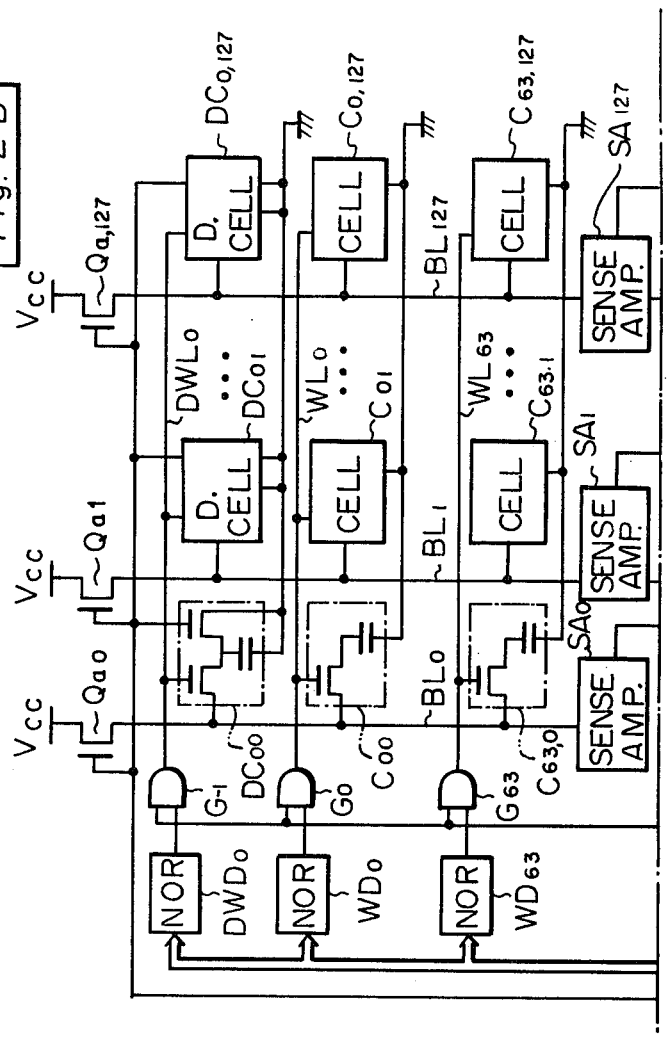
FIGS. 2A and 2B are a block diagram of a conventional semiconductor memory device.
Figure 2B:
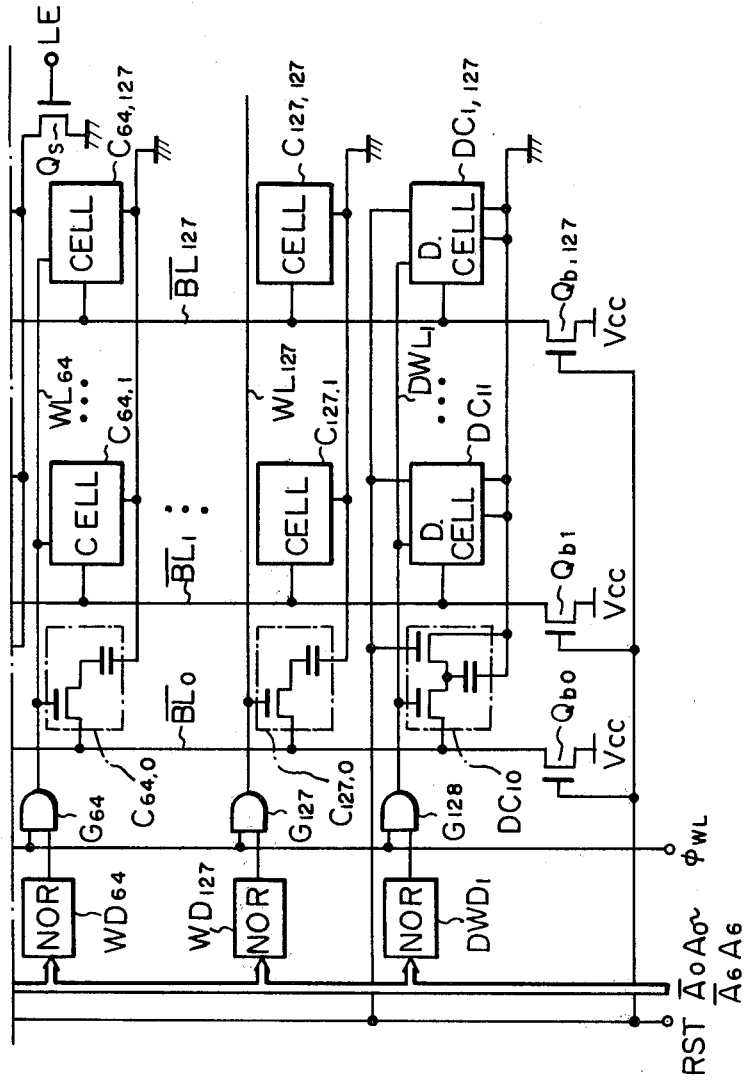

FIG. 2 is a block diagram illustrating a conventional semiconductor memory device incorporating a plurality of the above-mentioned memory cells of a one-transistor and one-capacitor type. In FIG. 2, for example, 16,384 memory cells $C_{00}, C_{01}, \ldots, C_{0,127}; C_{10}, C_{11}, \ldots, C_{1,127}; \ldots, C_{127,127}$ are arranged in 128 rows and 128 columns to form matrixes at intersections of word lines $WL_0, \ldots, WL_{63}, WL_{64}, \ldots, WL_{127}$ and bit lines $\overline{BL_0}$, $BL_0, \overline{BL_1}, BL_1, \ldots, BL_{127}, \overline{BL_{127}}$. In this case, each sense amplifier, $SA_0, SA_1, \ldots, SA_{127}$, is located between each pair of the bit lines, such as $BL_0$ and $\overline{BL_0}$, with each bit line being connected to a respective side of the sense amplifier.

In addition, dummy memory cells $DC_{00}, DC_{01}, \ldots, DC_{0,127}$ are connected to the bit lines $\overline{BL_0}, \overline{BL_1}, \ldots, \overline{BL_{127}}$, respectively, while dummy memory cells $DC_{10}, DC_{11}, \ldots, DC_{1,127}$ (FIG. 2B) are connected to the bit lines $BL_0, BL_1, \ldots, BL_{127}$, respectively. Further, transistors $Q_{a0}, Q_{a1}, \ldots, Q_{a,127}$ are connected to the bit lines $BL_0, BL_1, \ldots, BL_{127}$, respectively, in order to precharge these bit lines, while, transistors $Q_{b0}, Q_{b1}, \ldots, Q_{b,127}$ (FIG. 2B) are connected to the bit lines $\overline{BL_0}, \overline{BL_1}, \ldots, \overline{BL_{127}}$, respectively, in order to precharge these bit lines.

In order to select one of the word lines $WL_0, \ldots, WL_{63}, WL_{64}, \ldots, WL_{127}$, word decoders $WD_0, \ldots, WD_{63}, WD_{64}, \ldots, WD_{127}$ each comprising an NOR gate, are connected to the word lines through gates $G_0, \ldots, G_{63}, G_{64}, \ldots, G_{127}$ which are controlled by a clock signal $\phi_{WL}$. In addition, in order to select one of dummy word lines $DWL_0$ and $DWL_1$, dummy word decoders $DWD_0$ and $DWD_1$ each comprising an NOR gate are connected to the dummy word lines through gates $G_{-1}$ and $G_{128}$ which are also controlled by the clock signal $\phi_{WL}$. In this case, each of the word decoders $WD_0, \ldots, WD_{63}, WD_{64}, \ldots, WD_{127}$ receives a combination of seven signals $\bar{A}_0, A_0, \ldots, \bar{A}_6, A_6$, selected from fourteen address signals, while each of the dummy word decoders $DWD_0$ and $DWD_1$ receives a signal, for example, the address signal $A_6$ and $\bar{A}_6$, respectively.

Figure 3:
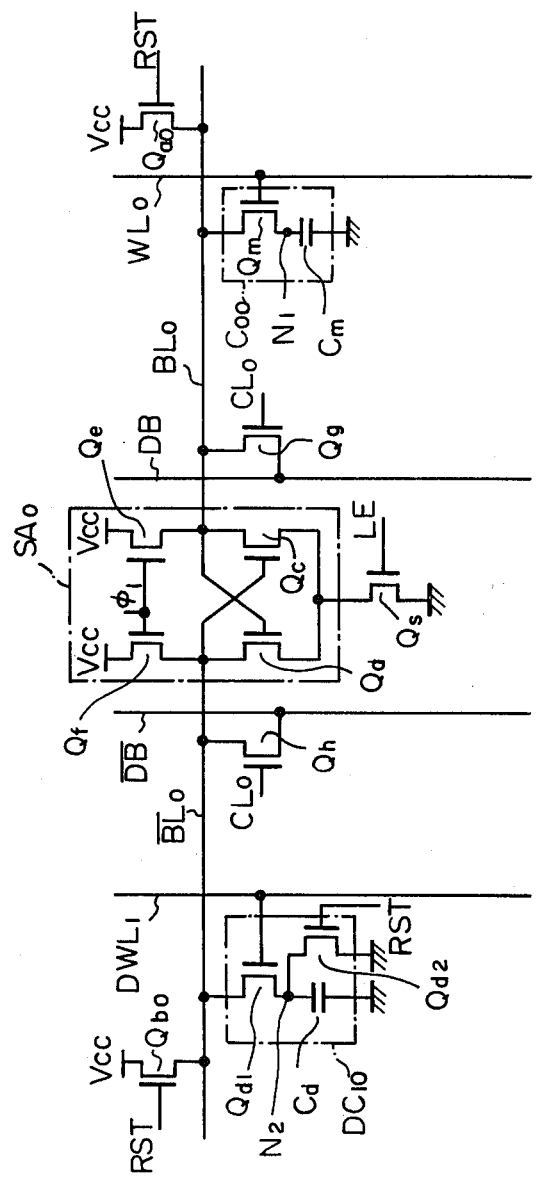
FIG. 3 is a circuit diagram of a part of the device of FIG. 2.
Figures 4A, 4B, 4C:
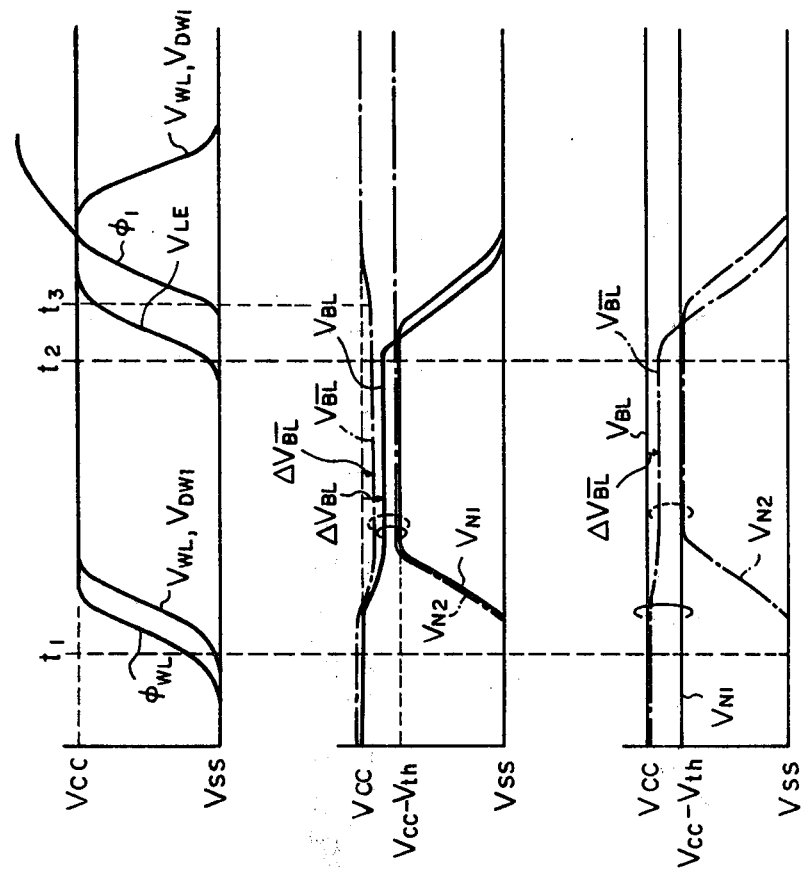
FIGS. 4A, 4B and 4C are timing diagrams of the signals appearing in the circuit of FIG. 3.

The operation of the device of FIG. 2 will be explained by using FIG. 3 and FIGS. 4A, 4B and 4C. FIG. 3 is a circuit diagram of a part of the device of FIG. 2, for explaining the read operation of the memory cell $C_{00}$ and FIGS. 4A, 4B and 4C are timing diagrams of the signals appearing in the circuit of FIG. 3. In more detail, FIGS. 4B and 4C are used for explaining the read operation for reading the data "0" and "1", respectively. Note that the capacitance of a capacitor $C_d$ of the dummy memory cell $DC_1$ is about one-half of that of a capacitor $C_m$ of the memory cell $C_{00}$.

In FIG. 3, the sense amplifier $SA_0$ comprises two cross-coupled transistors $Q_c$ and $Q_d$ which constitute a flip-flop, and two transistors $Q_e$ and $Q_f$ for pulling up the bit lines $BL_0$ and $\overline{BL_0}$. In addition, the bit lines $BL_0$ and $\overline{BL_0}$ are connected to data bus lines DB and $\overline{DB}$, respectively, by transistors $Q_g$ and $Q_h$ controlled by a column selection signal $CL_0$ which are, however, not shown in FIG. 2. In addition, the dummy cell $DC_1$ comprises a transistor $Q_{d1}$ and a capacitor $C_d$ which are similar to the transistor $Q_m$ and the capacitor $C_m$, respectively, of the memory cell $C_{00}$ and in addition, a transistor $Q_{d2}$ for discharging the capacitor $C_d$ in the stand-by state.

In the stand-by state, the transistors $Q_{a0}$ and $Q_{b0}$ are turned on by the potential of the reset signal RST being high, so that the bit lines $BL_0$ and $\overline{BL_0}$ are precharged to the power supply voltage $V_{cc}$ and simultaneously, a transistor $Q_{d2}$ of the dummy memory cell $DC_1$ is also turned on, so that the capacitor $C_d$ is discharged; that is, the potential at a node $N_2$ is the power supply voltage $V_{ss}$ (ground). After that, the potential of the reset signal RST returns to the voltage $V_{ss}$ so that the bit lines $BL_0$ and $\overline{BL_0}$ are floating.

In order to read the data stored in the cell $C_{00}$, the word decoder $WD_0$ (FIG. 2) is triggered and as illustrated in FIG. 4A, the potential of the clock signal $\phi_{WL}$ rises, so that the potential $V_{WL}$ of the word line $WL_0$ rises at a time $t_1$, and accordingly the transistor $Q_m$ conducts. As a result, if the data stored in the cell $C_{00}$ is "0", a current flows from the bit line $BL_0$ into a node $N_1$ of the cell $C_{00}$, so that, as illustrated in FIG. 4B, the potential $V_{BL}$ of the bit line BL falls from $V_{cc}$ to $V_{cc} - \Delta V_{BL}$ and in turn, the potential $V_{N1}$ at the node $N_1$ rises from $V_{ss}$ to $V_{cc} - V_{th}$, where $V_{th}$ is a threshold voltage of the transistor $Q_m$. In this case, the voltage-drop $\Delta V_{BL}$ is $$\Delta V_{BL} = \frac{C}{C + C_B} (V_{cc} - V_{th})$$

where $C_B$ and C are capacitances of the bit line BL and the capacitor $C_m$, respectively. On the other hand, simultaneously, the dummy word decoder $DWD_1$ (FIG. 2) is triggered so that the potential $V_{DW1}$, as illustrated in FIG. 4A, of the dummy word line $DWL_1$ rises and accordingly, a transistor $Q_{d1}$ conducts. As a result, a current flows from the bit line $\overline{BL_0}$ into a node $N_2$ of the dummy memory cell $DC_1$, so that, as illustrated in FIG. 4B, the potential $V_{BL}$ of the bit line $BL_0$ falls from $V_{cc}$ to $V_{cc} - \Delta V_{\overline{BL}}$ and in turn, the potential $V_{N2}$ at the node $N_2$ rises from $V_{ss}$ to $V_{cc} - V_{th}$. In this case, the voltage-drop $\Delta V_{\overline{BL}}$ is selected so as to satisfy $\Delta V_{\overline{BL}} = \frac{1}{2} \Delta V_{BL}$.

Contrary to the above, if the data stored in the cell $C_{00}$ is "1", no current flows from the bit line $BL_0$ into the node $N_1$ of the cell $C_{00}$, so that the potential $V_{BL}$ of the bit line BL remains at the same level $V_{cc}$ and the potential $V_{N1}$ at the node $N_1$ also remains at the same level $V_{cc} - V_{th}$. On the other hand, in the dummy memory cell $DC_1$, as in the case where the data "0" is stored, the potential $V_{\overline{BL}}$ of the bit line $\overline{BL_0}$ falls from $V_{cc}$ to $V_{cc} - \Delta V_{BL}$ and in turn, the potential $V_{N2}$ at the node $N_2$ rises from $V_{ss}$ to $V_{cc} - V_{th}$, as illustrated in FIG. 4C.

In any case, the difference $\frac{1}{2} \Delta V_{BL}$ in potential between the bit lines $BL_0$ and $\overline{BL_0}$ is generated. Therefore, at a time $t_2$, the potential $V_{LE}$ of a latch enable signal LE rises so as to trigger the sense amplifier $SA_0$. As a result, one of the potentials $V_{BL}$ and $V_{\overline{BL}}$ reaches $V_{cc}$ and the other reaches $V_{ss}$.

Note that, in FIG. 4B, at a time $t_3$, the potential $V_{\overline{BL}}$ of the bit line $\overline{BL}_0$ rises from $V_{cc} - \Delta V_{\overline{BL}}$ to $V_{cc}$ due to the active pull-up effect, since the potential of a signal $\phi_1$ rises so that the transistors $Q_e$ and $Q_f$ become conductive.

Next, by causing the potential of a column selection signal $CL_0$ to be high, the potentials of the bit lines $BL_0$ and $\overline{BL}_0$ are transmitted into an input/output amplifier (not shown) through the data bus lines DB and $\overline{DB}$. After the read operation is completed, the potential $V_{WL}$ of the word line $WL_0$ becomes $V_{ss}$ so that the memory device is in the stand-by state. At this time, the data "0" or "1" is stored in the memory cell $C_{00}$.

In the case of the data "0" being stored in the memory cell $C_{00}$, the charge $Q_1 = 0$ is stored in the capacitor $C_m$, while, in the case of the data "1" being stored in the memory cell $C_{00}$, the charge $Q_2 = C(V_{cc} - V_{th})$ is stored in the capacitor $C_m$. Therefore, the difference $\Delta Q$ in charges between the data "0" and "1" is $\Delta Q = C(V_{cc} - V_{th})$. In the present invention, the difference $\Delta Q$ is increased so as to increase the difference in potential between the bit lines $BL_0$ and $\overline{BL}_0$ prior to the operation of the sense amplifier $SA_0$, this increases the stability of the sense amplifier $SA_0$ operation.

Figures 5, 5A:
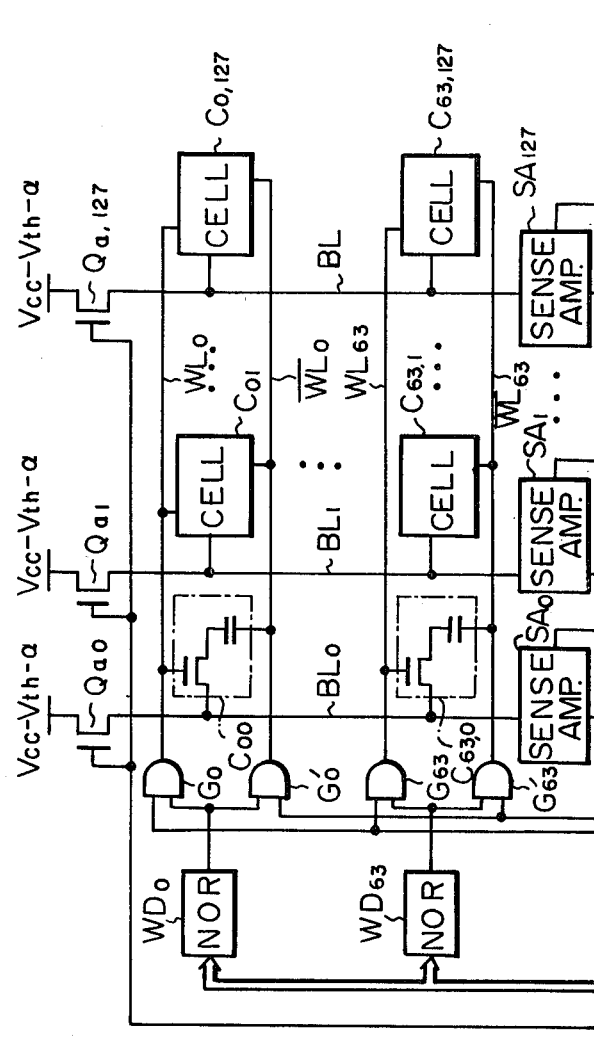
FIGS. 5, 5A and 5B are block diagram of an embodiment of the semiconductor memory device according to the present invention.
Figure 5B:
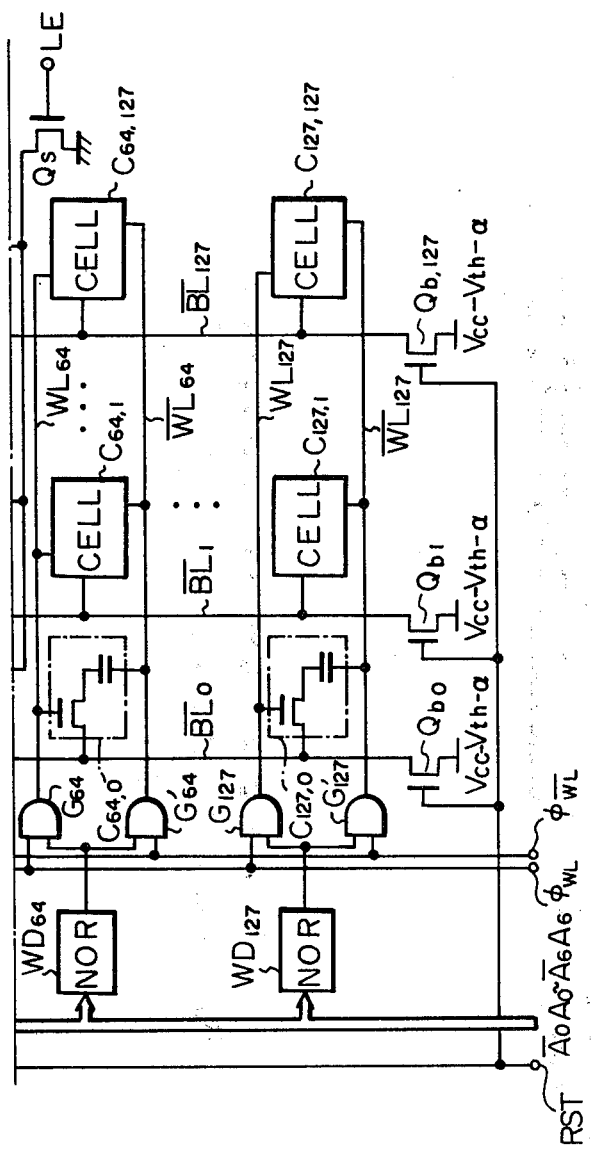

FIG. 5 is a block diagram illustrating an embodiment of the semiconductor memory device according to the present invention. In FIG. 5, the elements which are the same as those of FIG. 2 are denoted by the same references. In FIG. 5, the memory cells $C_{00}, C_{01}, \ldots, C_{0,127}$; $C_{10}, C_{11}, \ldots, C_{1,127}$; $\ldots$; $C_{127,127}$ are connected to power supply lines $\overline{WL}_0, \ldots, \overline{WL}_{63}, \overline{WL}_{64}, \ldots, \overline{WL}_{127}$, not to the power supply $V_{ss}$ (ground). In this case, the potentials of the power supply lines $\overline{WL}_0, \ldots, \overline{WL}_{63}, \overline{WL}_{64}, \ldots, \overline{WL}_{127}$ are changeable. However, the dummy memory cells $DC_{00}, DC_{01}, \ldots, DC_{0,127}$ and $DC_{10}, DC_{11}, \ldots, DC_{1,127}$ of FIG. 2 are not provided. Further, the potential for precharging the bit lines $BL_0$ and $\overline{BL}_0$ is $V_{cc} - V_{th} - \alpha$. Here, $\alpha$ is a voltage necessary for maintaining the conduction of the transistor $Q_m$ when the potential $V_{WL}$ of the word line $WL_0$ is $V_{cc}$.

In the present invention, the charges stored in the capacitors C of the memory cells are increased by causing the potentials of the power supply lines $\overline{WL}_0, \ldots, \overline{WL}_{63}, \overline{WL}_{64}, \ldots, \overline{WL}_{127}$ to be low and after that, to be high. The changes of the potentials of the power supply lines $\overline{WL}_0, \ldots, \overline{WL}_{63}, \overline{WL}_{64}, \ldots, \overline{WL}_{127}$ can be effected by a clock signal $\phi_{\overline{WL}}$ through gates $G_0', \ldots, G_{63}', G_{64}', \ldots, G_{127}'$.

Figure 6:
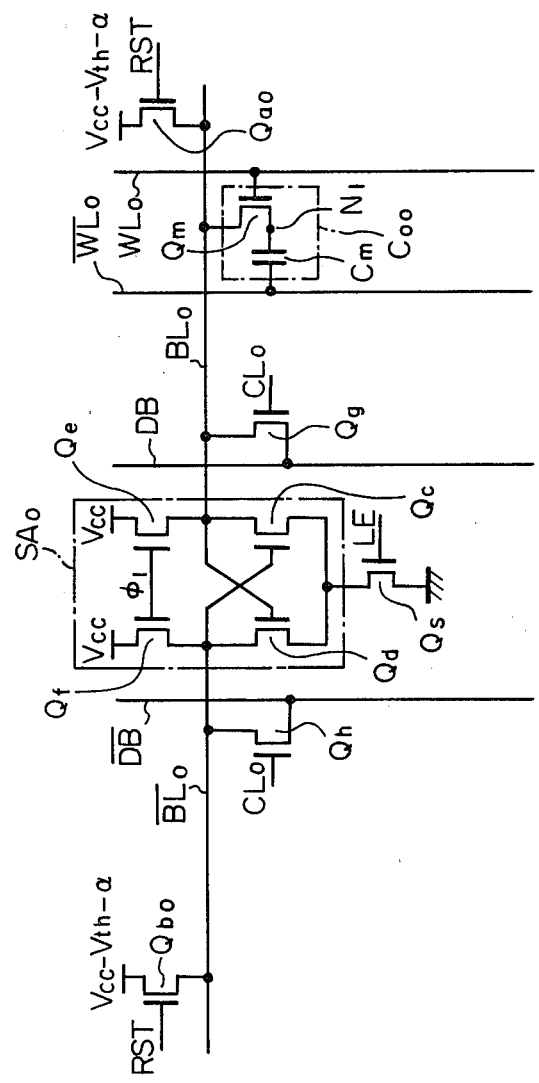
FIG. 6 is a circuit diagram of a part of the device of FIG. 5.

The operation of the device of FIG. 5 will be explained by using FIG. 6 and FIGS. 7A, 7B and 7C. Here, FIG. 6 is a circuit diagram of a part of the device of FIG. 5 and FIGS. 7A, 7B and 7C are timing diagrams of the signals appearing in the circuit of FIG. 5. In more detail, FIGS. 7B and 7C are used for explaining the read operation for reading the data "0" and "1", respectively.

In the stand-by state, the transistors $Q_{a0}$ and $Q_{b0}$ (FIG. 5) are turned on by causing the potential of the reset signal RST to be high, during this time the bit lines $BL_0$ and $\overline{BL}_0$ are precharged to $V_{cc} - V_{th} - \alpha$. After the charging, the potential of the signal RST returns to the voltage $V_{ss}$ (ground) placing the bit lines $BL_0$ and $\overline{BL}_0$ in a floating state.

In order to read the data stored in the cell $C_{00}$, the word decoder $WD_0$ (FIG. 5) is triggered and, as illustrated in FIG. 7A the potential of the clock signal $\phi_{WL}$ rises, so that the potential $V_{WL}$ of the word line $WL_0$ rises at a time $t_1$. As a result, the transistor $Q_m$ conducts and accordingly, if the data stored in the cell $C_{00}$ is "0," a current flows from the bit line $BL_0$ into the node $N_1$ of the cell $C_{00}$. Therefore, as illustrated in FIG. 7B, the potential $V_{BL}$ of the bit line BL falls from the precharged potential $V_{cc} - V_{th} - \alpha$ to $V_{cc} - V_{th} - \alpha - \Delta V_{BL}$ and in turn, the potential $V_{N1}$ at the node $N_1$ rises from $V_{ss}$ to $V_{cc} - V_{th} - \alpha \Delta V_{BL}$. In this case, the voltage-drop $\Delta V_{BL}$ is $$\Delta V_{BL} = \frac{C}{C + C_B} (V_{cc} - V_{th} - \alpha).$$

On the other hand, the potential $V_{\overline{BL}}$ of the bit line $\overline{BL}_0$ remains at the same level, since there is no dummy memory cell connected to the bit line $\overline{BL}_0$.

At a time $t_2$ when the potential $V_{LE}$ of the latch enable signal LE rises as illustrated in FIG. 7A, the sense amplifier $SA_0$ is triggered so as to amplify the potential difference $\Delta V_{BL}$, as illustrated in FIG. 7B. After that, the potential of the signal $\phi_1$ rises as illustrated in FIG. 7A, and the potential $V_{BL}$ of the bit line BL is pulled up to $V_{cc}$ via transistor $Q_f$. Thus, the read operation for the data "1" is completed.

Next, as illustrated in FIG. 7A, the potential of the signal $\phi_{\overline{WL}}$ falls from $V_{cc}$ to $V_{ss}$ and after that, again, it rises from $V_{ss}$ to $V_{cc}$. Accordingly, at a time $t_3$, the potential $V_{\overline{WL}}$ of the power supply line $\overline{WL}_0$ falls from $V_{cc}$ to $V_{ss}$ and, at a time $t_4$, it rises from $V_{ss}$ to $V_{cc}$. During the falling of the potential $V_{\overline{WL}}$, the potential $V_{N1}$ falls due to the capacitive coupling of the line $\overline{WL}_0$ and the node $N_1$; however, the potential $V_{N1}$ immediately returns to $V_{ss}$ due to transistor $Q_m$ being ON, as illustrated in FIG. 7B. In this case, a small quantity of charges is stored in the capacitor $C_m$. After that, during the rising of the potential $V_{\overline{WL}}$, the potential $V_{N1}$ rises also due to capacitive coupling; however, also in this case, the potential $V_{N1}$ returns to $V_{ss}$, so that the charges stored in the capacitor $C_m$ flow out. Thus, the refresh operation for the data "0" is completed.

It should be noted that, in the above-mentioned operation, the transistor $Q_m$ is always conductive, since the difference in potential between the gate and the source (or drain) is larger than the threshold voltage $V_{th}$ of the transistor $Q_m$.

Contrary to the above, if the data stored in the cell $C_{00}$ is "1," that is, the potential $V_{N1}$ at the node $N_1$ is higher than $V_{cc} - V_{th} - \alpha$, a current flows from the node $N_1$ to the bit line $BL_0$ when the potential $V_{WL}$ of the word line $WL_0$ is $V_{cc}$. As a result, the potential $V_{BL}$ of the bit line $BL_0$ rises, while, the potential $V_{\overline{BL}}$ of the bit line $\overline{BL}$ remains at the level $V_{cc} - V_{th} - \alpha$. In this case, the difference in potential between the bit lines $BL_0$ and $\overline{BL}_0$ is defined as $\Delta V_{BL}$, as illustrated in FIG. 7C. At the time $t_2$, the difference $\Delta BL$ is amplified so that the potential $V_{\overline{BL}}$ of the bit line $BL_0$ reaches $V_{cc}$ and the potential $V_{BL}$ of the bit line $\overline{BL}_0$ reaches $V_{ss}$. In this case, the potential $V_{N1}$ at the node $N_1$ is $V_{cc} - V_{th}$.

As illustrated in FIG. 7A, at the time $t_3$ when the potential $V_{\overline{WL}}$ of the power supply line $\overline{WL}_0$ is changed from $V_{cc}$ to $V_{ss}$, the potential $V_{N1}$ at the node $N_1$ falls due to the capacitive coupling, as illustrated in FIG. 7C, so that a current flows from the bit line $\overline{BL}_0$ into the node $N_1$. As a result, a quantity of charges is stored in the capacitor $C_m$. Next, at the time $t_4$ when the potential $V_{\overline{WL}}$ is changed from $V_{ss}$ to $V_{cc}$, the potential $V_{N1}$ at the node $N_1$ rises so that the charges stored in the capacitor $C_m$ tend to flow out; however, in this state, the charges never flow out. This is because, at this time, the potential $V_{WL}$ applied to the gate of the transistor $Q_m$ and the potential $V_{BL}$ applied to the drain of transistor $Q_m$ are both $V_{cc}$, so that the transistor $Q_m$ is non-conductive. Therefore, when the potential $V_{\overline{WL}}$ of the power supply line $\overline{WL}_0$ is changed from $V_{ss}$ to $V_{cc}$, a value $V_{cc}$ is added to the potential $V_{N1}$ at the node $N_1$ so that this potential $V_{N1}$ becomes $2V_{cc}-V_{th}$. This is a so-called bootstrap effect. Thus, after the read operation and the refresh operation for the data "1" are completed, the charge $(2V_{cc}-V_{th})\times C$ is stored in the capacitor $C_m$.

Therefore, prior to the read operation for the data "1", the potential $V_{N1}$ at the node $N_1$ is $2V_{cc}-V_{th}$, as illustrated in FIG. 7C. In this state, again at the time $t_1$ when the potential $V_{WL}$ of the word line $WL_0$ is changed from $V_{ss}$ to $V_{cc}$, a current flows from the node $N_1$ into the bit line $BL_0$, so that the potential $V_{N1}$ at the node $N_1$ is decreased and in turn, the potential $V_{BL}$ of the bit line $BL_0$ is increased. In this case, the voltage-increase $\Delta V_{BL}$ of the potential $V_{BL}$ is $$\Delta V_{BL} = \frac{C}{C + C_B} \{(2V_{cc} - V_{th}) - (V_{cc} - V_{th} - \alpha)\}$$

$$= \frac{C}{C + C_B} (V_{cc} + \alpha).$$

On the other hand, the potential $V_{\overline{BL}}$ of the bit line $\overline{BL}_0$ remains at the same level $V_{cc}-V_{th}-\alpha$, since there is no dummy cell.

Thus, in the circuit of FIG. 6, the differences in potential between the bit lines $BL_0$ and $\overline{BL}_0$, prior to the operation of the sense amplifier $SA_0$, are $$\frac{C}{C + C_B} (V_{cc} - V_{th} - \alpha) \text{ and } \frac{C}{C + C_B} (V_{cc} + \alpha)$$

for the data "0" and "1", respectively. As compared with the conventional circuit of FIG. 3 in which such a difference is $$\tfrac{1}{2} \times \frac{C}{C + C_B} (V_{cc} - V_{th}),$$

the increase of the charge stored in the capacitor $C_m$ contributes to the increase of the difference in potential between the bit lines $BL_0$ and $\overline{BL}_0$, which means that the stored charges in the capacitor $C_m$ are helpful in the read operation.

In the above-mentioned embodiment, the difference in potential between the bit lines $BL_0$ and $\overline{BL}_0$ for the data "0" is different from the difference for the data "1"; however, the two differences can be equal by providing an appropriate dummy memory cell.

Figure 8A:
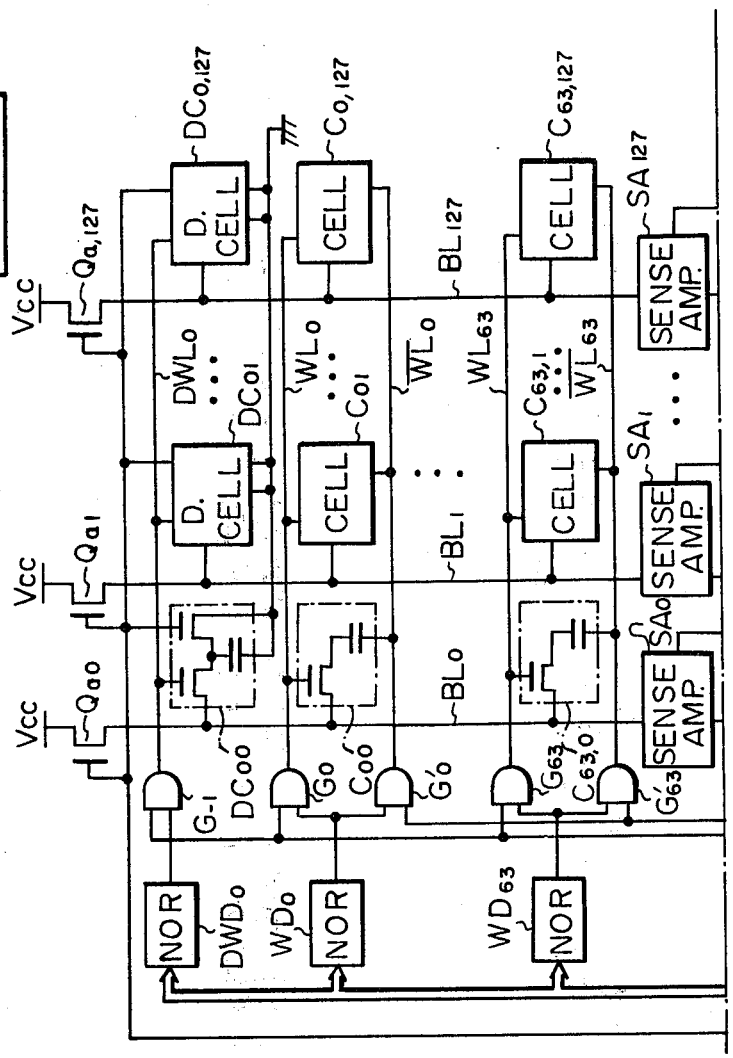
Figure 8B:
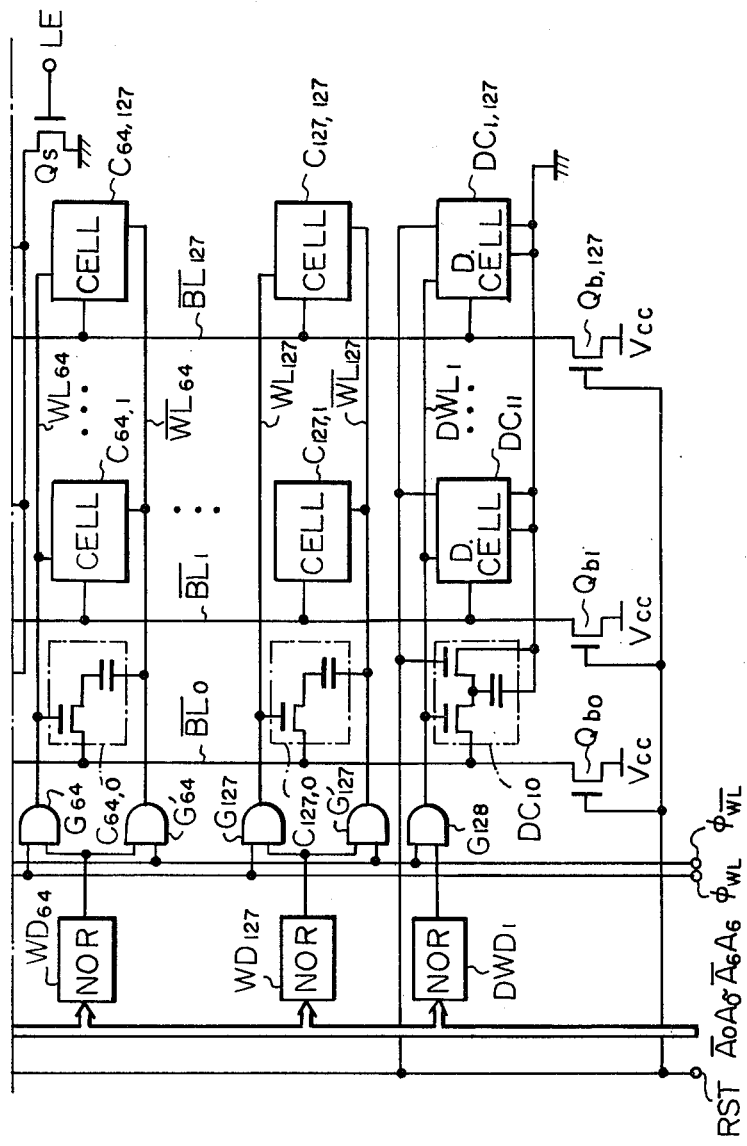

FIG. 8 is a block diagram illustrating another embodiment of the semiconductor memory device according to the present invention. In FIG. 8, the elements which are the same as those of FIG. 5 are denoted by the same references. In FIG. 8, dummy memory cells $DC_{00}, DC_{01}, \ldots, DC_{0,127}; DC_{10}, DC_{11}, \ldots, DC_{1,127}$ are provided in addition to the memory cells in FIG. 5. In this case, the capacitance of a capacitor of the dummy memory cells is the same as that of the memory cells.

Figure 9:
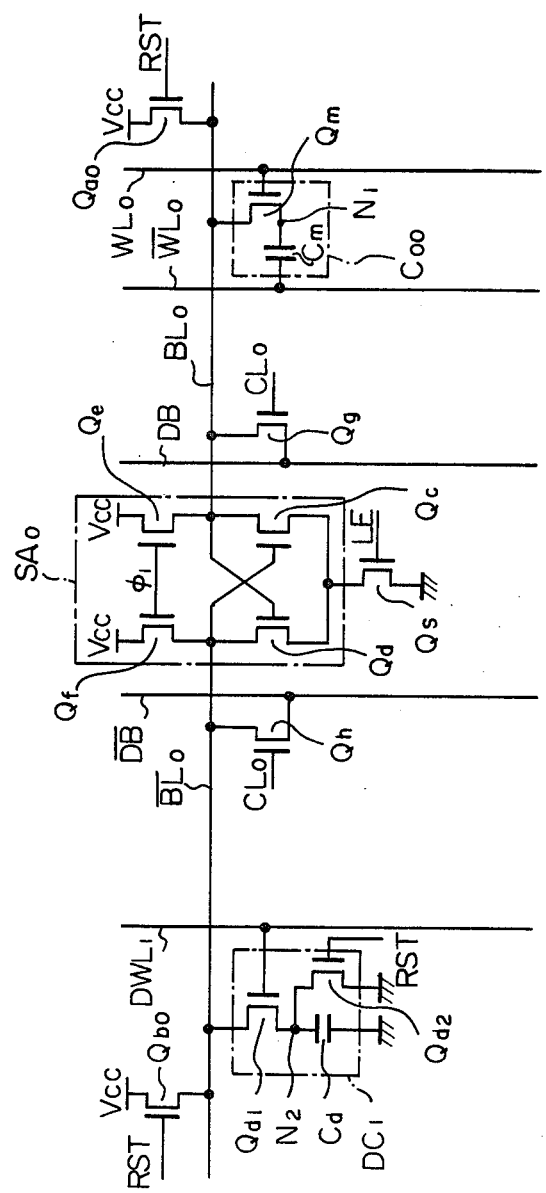
FIG. 9 is a circuit diagram of a part of the device of FIG. 8.

The operation of the device of FIG. 8 will be explained by using FIG. 9 and FIGS. 10A, 10B and 10C. Here, FIG. 9 is a circuit diagram of a part of the device of FIG. 8 and FIGS. 10A, 10B and 10C are timing diagrams of the signals appearing in the circuit of FIG. 9. In more detail, FIGS. 7B and 7C are used for explaining the read operation for reading the data "0" and "1", respectively.

In the stand-by state, the bit lines $BL_0$ and $\overline{BL}_0$ are precharged to $V_{cc}$. In order to read the data "0", at the time $t_1$ when the potentials $V_{WL}$ and $V_{DW1}$ are changed from $V_{ss}$ to $V_{cc}$, the potentials $V_{BL}$ and $V_{\overline{BL}}$ of the bit lines $BL_0$ and $\overline{BL}_0$ are both decreased from $V_{cc}$ to $V_{cc}-\Delta V_{BL}$ ($=\Delta V_{\overline{BL}}$), as illustrated in FIG. 10B. The voltage-drop $\Delta V_{BL}$ ($=\Delta V_{\overline{BL}}$) is, in this case, $$\Delta V_{BL} = \Delta V_{\overline{BL}} = \frac{C}{C + C_B} (V_{cc} - V_{th})$$

After that, at the time $t_2$ when the potential $V_{\overline{WL}}$ of the power supply line $\overline{WL}_0$ is changed from $V_{cc}$ to $V_{ss}$, a current flows from the bit line $BL_0$ to the node $N_1$ of the cell $C_{00}$, so that the potential $V_{BL}$ of the bit line $BL_0$ is further decreased by $$\frac{C}{C + C_B} V_{cc}.$$

As a result, the difference in potential between the bit lines $BL_0$ and $\overline{BL}_0$ is $$\frac{C}{C + C_B} V_{cc}.$$

On the other hand, if the data stored in the cell $C_{00}$ is "1", at the time $t_1$, a current flows from the bit line $\overline{BL}_0$ to the node $N_2$ so that the potential $V_{N2}$ at the node $N_2$ rises from $V_{ss}$ to $V_{cc}-V_{th}$ and in turn, the potential $V_{\overline{BL}}$ of the bit line $\overline{BL}_0$ falls, as illustrated in FIG. 10C. In this case, the voltage-drop $\Delta V_{\overline{BL}}$ is $$\Delta V_{\overline{BL}} = \frac{C}{C + C_B} (V_{cc} - V_{th}).$$

On the other hand, in the memory cell $C_{00}$, the transistor $Q_m$ remains non-conductive so that the potential $V_{BL}$ of the bit line $BL_0$ remains at the level $V_{cc}$. Next, at the time $t_2$, the falling of the potential $V_{\overline{WL}}$ of the power supply line $\overline{WL}_0$ causes the potential $V_{N1}$ at the node $N_1$, to also be decreased; however, even in this case, the transistor $Q_m$ remains non-conductive so that the potential $V_{BL}$ of the bit line $BL$ remains at the level $V_{cc}$. Therefore, the difference in potential between the bit lines $BL_0$ and $\overline{BL}_0$ is $$\frac{C}{C + C_B} (V_{cc} - V_{th}).$$

After such a difference in potential between the bit lines $BL_0$ and $\overline{BL}_0$ is generated, at the time $t_3$, the sense amplifier $SA_0$ is activated. As a result, as illustrated in FIGS. 10B and 10C, one of the potentials $V_{BL}$ and $V_{\overline{BL}}$ reaches $V_{ss}$ and the other reaches $V_{cc}$. Further, at the time $t_4$ when the potential $V_{\overline{WL}}$ is changed from $V_{ss}$ to $V_{cc}$, the potential $V_{N1}$ at the node $N_1$ returns to $V_{ss}$ or $2V_{cc}-V_{th}$ in accordance with the data being "0" or "1", as illustrated in FIG. 10B, 10C respectively.

In the embodiment as illustrated in FIGS. 8, 9, 10A, 10B and 10C, the falling of the potential $V_{\overline{WL}}$ of the power supply line $\overline{WL}_0$ follows the rising of the potential $V_{WL}$ of the word line $WL_0$; however, the falling of the potential $V_{\overline{WL}}$ can occur simultaneously with the rising of the potential $V_{WL}$, without problems. In addition, the two differences in potential between the bit lines $BL_0$ and $\overline{BL_0}$ for the data being "0" and "1" can be the same by selecting the capacitance of the capacitor $C_d$.

As explained hereinbefore, the present invention has an advantage, over the conventional device, in that the read operation is stable. This is because the charge stored in the memory cell can be about twice the usual charge, which increases the difference in potentials between a pair of bit lines prior to the operation of the sense amplifiers.

I claim:

1. A semiconductor memory device operatively connected to receive address signals and clock signals, said device comprising:
   first and second power supplies, the potential of said second power supply being lower than said first power supply potential;
   a plurality of word lines;
   a plurality of power supply lines;
   a plurality of pairs of bit lines;
   a plurality of sense amplifiers, respective of said sense amplifiers operatively connected between a corresponding pair of said pairs of bit lines;
   a plurality of memory cells, each comprising
   a transistor having a gate connected to a corresponding one of said word lines, a drain connected to a corresponding one of said bit lines, and a source,
   a capacitor having a predetermined capacitance and an electrode connected to the source of said transistor and another electrode connected to a corresponding one of said power supply lines; and
   clock means operatively connected to said power supply lines and to said word lines, for selectively supplying a clock signal to corresponding of said power supply lines in response to said address signals and after the potential of said corresponding word line rises and before the potential of said corresponding word line falls, the potential of said clock signal falls and after that, rises.

2. A device as set forth in claim 1, wherein said clock signal falls from the potential of said first power supply to the potential of said second power supply and after that, rises from the potential of said second power supply to the potential of said first power supply.

3. A device as set forth in claim 1 or 2, further comprising:
   two dummy word lines; and
   a plurality of dummy memory cells, respective of said dummy cells connected to a corresponding one of said bit lines, to a corresponding one of said two dummy word lines and to said second power supply.

4. A device as set forth in claim 3, wherein each of said dummy memory cells comprises:
   a first dummy transistor having a drain connected to said corresponding one of said bit lines, a gate connected to said corresponding one of said two dummy word lines;
   a dummy capacitor having predetermined capacitance and a first electrode connected to a source of said first dummy transistor and a second electrode connected to receive said second power supply; and
   a second dummy transistor having a drain and a source connected to the first electrode and to the second electrode, respectively, and a gate for receiving a reset signal.

5. A device as set forth in claim 4, wherein the capacitance of the dummy capacitor of said dummy memory cells is the same as that of the capacitor of said memory cells.

6. The device as set forth in claim 3, wherein each of said sense amplifiers comprises means for latching data from said corresponding pair of said pairs of bit lines, and wherein said fall and rise of said clock signal occurs after said latching.

7. A dynamic semiconductor memory device operatively connected to receive address signals and clock signals, a first power supply voltage, and a second power supply voltage lower than said first power supply voltage, comprising:
   a plurality of word lines, each having a potential;
   a plurality of power supply lines arranged parallel to said word lines;
   a plurality of bit line pairs, said bit line pairs and said word lines arranged in a matrix;
   a plurality of sense amplifiers, respective of said sense amplifiers operatively connected between a corresponding pair of said bit line pairs, and comprising means for latching data from said corresponding pair of said pairs of bit lines;
   a plurality of memory cells arranged at cross points of said matrix, each of said memory cells comprising
   a transistor having a gate connected to a corresponding one of said word lines, a drain connected to a corresponding one of said bit lines, and a source,
   a capacitor having a predetermined capacitance, having a first electrode connected to the source of said transistor and having a second electrode connected to a corresponding one of said power supply lines; and
   clock means operatively connected to receive said clock signals and said address signals and operatively connected to said word lines and said power supply lines for providing a negative clock pulse to corresponding ones of said word lines and power supply lines responsive to corresponding ones of said address signals and of said clock signals, wherein said clock means comprises means for providing control signals responsive to said corresponding of said control signals and to said clock signals, for providing said negative clock pulse after the potential of at least one of said corresponding ones of said word lines rises and before said potential falls.

8. A method of accessing a dynamic semiconductor memory device, which is operatively connected to receive address signals, a first power supply voltage, a second power supply voltage lower than the first power supply voltage, the device including power supply lines, word lines, bit line pairs, a memory cell array connected to the word lines, the power supply lines, and the bit line pairs, and sense amplifiers respectively connected to corresponding bit line pairs, each sense amplifier having an enable and disable state, said method comprising the sequential steps of:
   (a) precharging the bit line pairs to a predetermined voltage;
   (b) selecting one of the word lines, the sense amplifiers, the bit line pairs and the power supply lines;

(c) applying the first power supply voltage to the selected word line;
(d) enabling the selected sense amplifier;
(e) applying the first power supply voltage to the selected bit line pair through the selected sense amplifier;

(f) applying the second power supply voltage to the selected power supply line;
(g) applying the first power supply voltage to the selected power supply line; and
(h) applying the second power supply voltage to the selected word line.

* * * * *

UNITED STATES PATENT AND TRADEMARK OFFICE
CERTIFICATE OF CORRECTION

PATENT NO. : 4,409,672

DATED : October 11, 1983

INVENTOR(S) : Yoshihiro Takemae

It is certified that error appears in the above-identified patent and that said Letters Patent is hereby corrected as shown below:

Front Page - Other Publications
"vol." should be --Vol.--.

Column 3, line 26, "$\overline{BL_0}$" should be --$BL_0$--;
line 27, "$\overline{BL_1}$" (first occurrence) should be --$BL_1$--;
line 33, "$\overline{BL_0}$, $\overline{BL_1}$" should be --$BL_0$, $BL_1$--;
line 34, "$\overline{BL_{127}}$" should be --$BL_{127}$--;
line 36, "$BL_0$, $BL_1$" should be --$\overline{BL_0}$, $\overline{BL_1}$--;
"$BL_{127}$" should be --$\overline{BL_{127}}$--;
line 58, "$A_6$" (second occurrence) should be --$\overline{A_6}$--.

UNITED STATES PATENT AND TRADEMARK OFFICE
CERTIFICATE OF CORRECTION

PATENT NO. : 4,409,672   Page 2 of 2
DATED : October 11, 1983
INVENTOR(S) : YOSHIHIRO TAKEMAE It is certified that error appears in the above-identified patent and that said Letters Patent is hereby corrected as shown below:

Column 4, line 33, "$\overline{V_{BL}}$" should be --$V_{BL}$--;

line 45, after "that" insert --, as illustrated in Fig. 4A,--; after "$V_{DWI}$" delete --, as illustrated--;

line 46, delete --In Fig. 4A--;

line 50, "$V_{BL}$" should be --$V_{\overline{BL}}$--; "$BL_0$" should be --$\overline{BL}_0$--;

Column 6, line 23, "$V_{BL}$" should be --$V_{\overline{BL}}$--;

line 57, "$V_{\overline{BL}}$" should be --$V_{BL}$--;

line 58, "$V_{BL}$" should be --$V_{\overline{BL}}$--;

Column 8, line 51, "$BL_0$" should be --$\overline{BL}_0$--; "$\overline{BL}_0$" should be --$BL_0$--;

Column 9, line 28, after "comprising" insert -- --(dash)--;

Column 10, line 30, after "comprising" insert -- --(dash)--;

Signed and Sealed this

Twenty-first Day of February 1984

[SEAL]

Attest:

GERALD J. MOSSINGHOFF

Attesting Officer   Commissioner of Patents and Trademarks